Oct. 14, 1969 P. A. ILES 3,471,924
PROCESS FOR MANUFACTURING INEXPENSIVE SEMICONDUCTOR DEVICES
Filed April 13, 1967
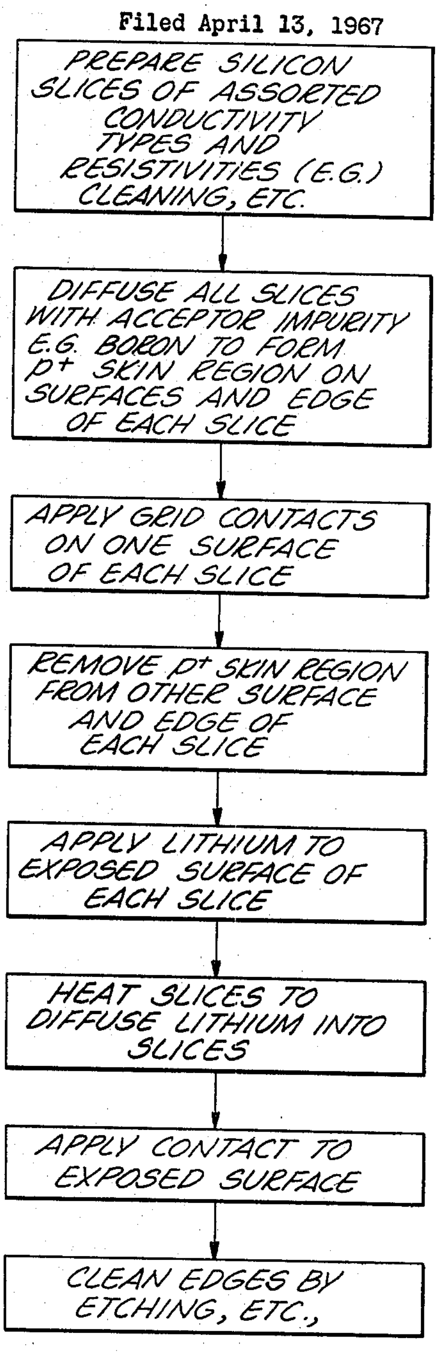
INVENTOR.
PETER ALBERT ILES
BY Lyon & Lyon
ATTORNEYS United States Patent Office 3,471,924

Patented Oct. 14, 1969

3,471,924

PROCESS FOR MANUFACTURING INEXPENSIVE SEMICONDUCTOR DEVICES

Peter Albert Iles, Arcadia, Calif., assignor, by mesne assignments, to Globe-Union Inc., Milwaukee, Wis., a corporation of Delaware Filed Apr. 13, 1967, Ser. No. 630,684

Int. Cl. H01l *15/02, 7/00;* B01j *17/00*

U.S. Cl. 29—572 11 Claims

ABSTRACT OF THE DISCLOSURE

Treating silicon bodies of differing resistivities and conductivity types with lithium to convert them into bodies of N-type conductivity and uniform resistivity.

Background of the invention

In order that there be uniformity of semiconductor devices manufactured in large lots and sold as devices having particular electrical characteristics, the starting semiconductor material must ordinarily have uniform characteristics, particularly resistivity and, of course, conductivity type. The starting silicon for most devices is in the form of thin wafers or blanks that are sliced from an ingot produced by any one of a number of known techniques. As resistivity may change from ingot to ingot, and even from wafer to wafer from the same ingot, a substantial amount of grading of the wafers or devices must be performed at one or more stages during the fabrication process so that the wafers or devices may be grouped according to their resistivity. Such grading and grouping requires considerable testing and analysis and thus contributes significantly to processing costs. In addition, the usual requirement of close tolerances of resistivity results in the scrapping of considerable amounts of expensive silicon.

A typical example of a device in which the above factors contribute significantly to ultimate cost is the silicon photovoltaic cell commonly known as a solar cell. In such a cell, a low resistivity starting or bulk material is generally desired (approximately 0.5 to 10 ohm-cm.) so that the internal resistance of the cell is kept to a minimum and the power output and conversion efficiency optimized. Because the power output is dependent on the resistivity of the bulk material, and since these cells are commonly used in large groups connected in various series-parallel relationships, the cells and the starting materials must be carefully grouped so that their properties are properly matched. As a consequence of the material and processing costs of these cells, they are generally restricted to use in space even though they would have many terrestrial applications if their cost was not prohibitive.

Summary of the invention

According to the present invention, a process has been discovered for treating a plurality of silicon wafers of different resistivities and even different conductivity types to convert all of the wafers to N-type conductivity and uniform resistivity. The process of this invention permits the use of a wide range of starting materials, including high resistivity material and other material that normally is scrapped. The need for grouping of the wafers is also eliminated. As a result, the ultimate cost of the devices made from the wafers is reduced. This is accomplished by diffusing lithium into the bulk region of the wafers after any other diffusion steps have been performed to form other regions therein. The process is applicable to the various different forms of silicon, for example, Czochralski grown, float zone refined, other crucibleless methods, dendritic web, etc. The process has not been found to degrade the P-N junctions made during previous diffusion steps, and the resultant devices have good electrical characteristics. The process of the invention is believed to be particularly useful in the manufacturing of silicon solar cells and therefore the following description will be of such a process. However, it should be understood that the process is also useful in the construction of other semiconductor devices requiring or using low resistivity bulk material, for example, computer diodes, or detector photovoltaic devices.

It is therefore an object of the present invention to provide a process for producing relatively inexpensive semiconductor devices.

It is another object of the present invention to provide a process for producing a plurality of semiconductor devices of N-type conductivity and uniformly low resistivity from a plurality of starting silicon wafers of varying resistivities and of either N or P-type conductivity.

Brief description of the drawing

The single figure of the drawing shows a flow diagram of the process of the present invention.

Description of the invention

The drawing shows the steps of the process of the present invention as used to construct a plurality of silicon photovoltaic cells having the same electrical characteristics. A plurality of wafers or slices of N-type, P-type or intrinsic monocrystalline silicon are subjected to conventional pre-diffusion preparation steps such as lapping, polishing, etching, cleaning and the like. Slices of silicon having resistivities from 0.2 ohm-centimeter to about 3500 ohm-centimeters have been successfully used in the process. The silicon must, of course, be of a quality suitable for use in semiconductor devices. After suitable preparation, the slices are subjected to a diffusion of an acceptor impurity such as boron. The diffusion step is conventional and causes a $P^+$ skin or surface layer to be formed over the entire exterior of each of the slices. Although this surface layer can be of any thickness, a suitable thickness for a solar cell is one-half micron so that the layer is essentially transparent and the junction is exposed to incident radiation. The diffusion parameters necessary to obtain such a layer are well-known to those skilled in the art. As a result of this boron diffusion, a junction is formed in each of the slices between the bulk region which retains the characteristics of the starting material and the surface region. Because of the different conductivity types of the starting slices, the junction in the various wafers may be $P^+$-N, $P^+$-P or even $P^+$-I.

After the diffusion step, the slices are cleaned if required, for example, to remove the borosilicate glass or other layers that may form during the diffusion. The grid contacts are then formed on the upper surface of each of the wafers by conventional techniques.

The $P^+$ skin is then removed from the opposite surface of each of the wafers and, if desired, from the edges. As is conventional, this removal of the $P^+$ surface layer can be accomplished by sandblasting, etching, or the like, to expose a surface of the bulk region. Lithium is then applied to this exposed surface. The lithium can be applied in any desired manner. For example, the lithium may be coated on the cell in an oil suspension and the suspending liquid then baked off or the pure lithium metal may be vacuum evaporated onto the exposed surface of the bulk silicon. The wafers are then inserted into a furnace at a temperature of between 350° and 550° C. for a time between ten minutes and three hours, the duration of the cycle being inverse to the furnace temperature. This treatment causes the lithium to diffuse into the bulk region of each of the wafers toward the junction. It should be understood that the diffusion of lithium into silicon semiconductor devices per se is old in the art and does not constitute the present invention. Because the diffusion constant of lithium is quite high, the cycle described causes movement of sufficient lithium as deep as 15 mils into the bulk silicon. It has been found that this diffusion of the lithium into the silicon causes the bulk silicon, if it was initially N-type conductivity to become highly doped and thus have a low resistivity. If the bulk silicon was initially P-type conductivity, the lithium overdopes it and again causes it to become very highly doped N-type. Regardless of the initial bulk conductivity characteristic, it has been found that the lithium in effect stops when it reaches the junction and does not degrade the P-N junction.

After the diffusion of lithium, an ohmic contact is made to the exposed surface of the bulk region and the edges cleaned by etching or the like. The semiconductor wafers are now $P^+/N$ cells having uniform, low resistivity N-type bulk regions. The resistivity of these regions is approximately 0.5 ohm-cm. It should be understood that the sequence of various of the process steps such as the formation of contacts can be changed if desired without departing from the present invention. However, the lithium diffusion should always be performed after all other diffusion steps because of its diffusion mobility.

From the foregoing description, it can be seen that a process has been provided for converting a plurality of silicon wafers of diverse properties into a plurality of P-N junction semiconductor devices having of uniform bulk resistivity and conductivity characteristics independent of whether the starting material was of N-type or P-type conductivity and independent of the resistivity of the starting material. While the invention has been described in connection with the fabrication of a solar cell, it should be obvious that it is equally useful for forming other semiconductor devices where a region of similar characteristics is desired. The process of the present invention significantly reduces the cost of the finished device as it permits diverse low-cost starting materials to be treated in identical fashion thus eliminating the necessity for grading and grouping, while opening up a far wider range of acceptable starting materials.

While the particular embodiments of the present invention have been shown and described, it will be obvious to those skilled in the art that changes and modifications may be made without departing from the invention in its broader aspects, and therefore, the aim in the appended claims is to cover all such changes and modifications as fall within the true spirit and scope of this invention.

I claim:

1. A process for producing photovoltaic devices having substantially equal bulk region resistivities from silicon wafers having resistivities in the range of about 0.2 to about 3,500 ohm-centimeters comprising:

(a) diffusing an acceptor impurity into at least one surface of said wafers to form a $P^+$-type conductivity region therein; and (b) diffusing sufficient lithium into the bulk region of said wafers adjacent said $P^+$-type conductive region to make said bulk region an N-type conductivity with low resistivity thereby forming a $P^+$-N junction separating said $P^+$-type conductivity region and said N-type bulk region.

2. The process according to claim 1 wherein said silicon wafers are initally of P-type conductivity.

3. The process according to claim 1 wherein said silicon wafers are initially N-type conductivity.

4. The process according to claim 1 wherein said acceptor impurity is boron.

5. The process according to claim 4 wherein the resistivity of said bulk region upon completion of step (b) is approximately 0.5 ohm-centimeter.

6. A process for concurrently producing a plurality of photovoltaic devices having substantially equal bulk region resistivities from a plurality of silicon wafers having resistivities in the range of about 0.2 to 3,500 ohm-centimeters and different conductivity types comprising:

(a) simultaneously diffusing an acceptor impurity into at least one surface of each of said silicon wafers to form a $P^+$-type conductivity region therein; and (b) simultaneously diffusing an amount of lithium into the bulk region adjacent to said $P^+$-type conductivity region of each of said silicon wafers sufficient to at least convert the bulk region of all the wafers of P-type conductivity into N-type conductivity thereby forming a $P^+$-N junction in each of said silicon wafers separating the $P^+$-type conductivity region and the N-type bulk region.

7. The process according to claim 6 wherein said acceptor impurity is boron.

8. The process according to claim 6 wherein the resistivity of said bulk regions after completion of step (b) is approximately 0.5 ohm-centimeter.

9. A process for concurrently producing a plurality of silicon photovoltaic cells having substantially equal bulk region resistivities from a plurality of silicon wafers having resistivities in the range of about 0.2 to about 3,500 ohm-centimeters and different conductivity types comprising:

(a) simultaneously diffusing an acceptor impurity into all the surfaces of each of said silicon wafers to form a $P^+$-type conductivity region therein;

(b) removing a portion of said $P^+$-type conductivity region from each of said wafers to expose a surface of the bulk region thereof;

(c) simultaneously diffusing an amount of lithium into said bulk region of each of said wafers through the exposed surface sufficient to at least convert the bulk region of all of the wafers having a bulk region of $P^+$-type conductivity into N-type conductivity thereby forming a $P^+$-N junction in each of said silicon wafers separating the $P^+$-type conductivity region and the N-type bulk region.

10. The process according to claim 9 wherein said acceptor impurity is boron.

11. The process according to claim 9 wherein the resistivity of said bulk regions after completion of step (b) is approximately 0.5 ohm-centimeter.

References Cited

UNITED STATES PATENTS

| | | | |
|---|---|---|---|
| 2,819,990 | 1/1958 | Fuller et al. | 148—186 |
| 2,908,871 | 10/1959 | McKay | 148—186 X |
| 3,089,793 | 5/1963 | Jordan et al. | 148—1.5 |
| 3,212,940 | 10/1965 | Blankenship | 148—186 X |
| 3,225,198 | 12/1965 | Mayer | 148—188 X |
| 3,310,443 | 3/1967 | Fessler et al. | 148—188 X |

PAUL M. COHEN, Primary Examiner

U.S. Cl. X.R.

29—576; 136—206; 148—188